United States Patent
Ishimine et al.

(10) Patent No.: US 11,961,747 B2
(45) Date of Patent: Apr. 16, 2024

(54) HEATER AND HEATER SYSTEM

(71) Applicant: KYOCERA Corporation, Kyoto (JP)

(72) Inventors: Yuusaku Ishimine, Aira (JP); Kazuto Maruyama, Kagoshima (JP); Keiichi Sekiguchi, Aira (JP); Kazuhiko Fujio, Satsumasendai (JP)

(73) Assignee: KYOCERA CORPORATION, Kyoto (JP)

( * ) Notice: Subject to any disclaimer, the term of this patent is extended or adjusted under 35 U.S.C. 154(b) by 494 days.

(21) Appl. No.: 16/979,634

(22) PCT Filed: Mar. 26, 2019

(86) PCT No.: PCT/JP2019/012891
§ 371 (c)(1),
(2) Date: Sep. 10, 2020

(87) PCT Pub. No.: WO2019/189197
PCT Pub. Date: Oct. 3, 2019

(65) Prior Publication Data
US 2021/0043475 A1    Feb. 11, 2021

(30) Foreign Application Priority Data
Mar. 28, 2018  (JP) .................... 2018-061453

(51) Int. Cl.
*H01L 21/67*  (2006.01)
*F27D 5/00*  (2006.01)
(Continued)

(52) U.S. Cl.
CPC ...... *H01L 21/67103* (2013.01); *F27D 5/0037* (2013.01); *H05B 1/0233* (2013.01); *H05B 3/283* (2013.01)

(58) Field of Classification Search
CPC ......... H01L 21/67109; H01L 21/67103; H01L 21/6831; H01L 21/6833; H01L 21/68757;
(Continued)

(56) References Cited

U.S. PATENT DOCUMENTS 6,464,790 B1 *  10/2002  Sherstinsky ........ H01L 21/6838
269/21
6,616,767 B2 *  9/2003  Zhao ................ H01L 21/67103
392/416
(Continued)

FOREIGN PATENT DOCUMENTS

CN    105518825 A  *  4/2016  ....... H01L 21/02002
JP    H09-162272 A    6/1997
(Continued)

*Primary Examiner* — Sang Y Paik
*Assistant Examiner* — Damon Joel David Alfaro
(74) *Attorney, Agent, or Firm* — Procopio, Cory, Hargreaves & Savitch LLP

(57) ABSTRACT

A heater includes an insulating base, a resistance heating element, and a hollow member. The base includes an upper surface and a lower surface. The resistance heating element extends inside the base along the upper surface and the lower surface. The hollow member includes a first plate-shaped part laid over the lower surface, a second plate-shaped part facing the first plate-shaped part through a space, and a side surface part surrounding the space from an outside in a planar direction of the first plate-shaped part and the second plate-shaped part.

12 Claims, 7 Drawing Sheets

(51) Int. Cl.
*H05B 1/02* (2006.01)
*H05B 3/28* (2006.01)

(58) Field of Classification Search
CPC ........... H01L 21/4807; H01L 21/67098; H01L 21/67248; H01L 21/67288; H01L 21/6835; H01L 21/6838; H01L 21/68785; H01L 21/68792; H01L 21/68714; F27D 5/0037; H05B 1/0233; H05B 3/143; H05B 3/26; H01J 37/32449; H01J 2237/002; H01J 37/3244
See application file for complete search history.

(56) References Cited

U.S. PATENT DOCUMENTS

| | | | | |
|---|---|---|---|---|
| 9,218,997 | B2* | 12/2015 | Jun | H02N 13/00 |
| 9,673,077 | B2* | 6/2017 | Lindley | C23C 16/4581 |
| 10,014,194 | B2* | 7/2018 | Tokusho | H05B 3/283 |
| 10,537,013 | B2* | 1/2020 | Silveira | H01L 21/67109 |
| 2009/0034148 | A1* | 2/2009 | Lubomirsky | H02N 13/00 |
| | | | | 361/234 |
| 2009/0235866 | A1* | 9/2009 | Kataigi | H01L 21/6875 |
| | | | | 118/725 |
| 2009/0266300 | A1* | 10/2009 | Iizuka | C23C 16/45561 |
| | | | | 118/728 |
| 2009/0283034 | A1* | 11/2009 | Natsuhara | H01L 21/68757 |
| | | | | 118/500 |
| 2010/0210115 | A1* | 8/2010 | Hara | H01L 21/67103 |
| | | | | 438/758 |
| 2012/0018416 | A1* | 1/2012 | Goto | H01L 21/68792 |
| | | | | 219/481 |
| 2013/0276980 | A1* | 10/2013 | Lubomirsky | H01J 37/32715 |
| | | | | 156/345.29 |
| 2014/0272211 | A1* | 9/2014 | Nguyen | H01J 37/32477 |
| | | | | 428/34.1 |
| 2014/0376897 | A1* | 12/2014 | Ranish | G02B 6/4249 |
| | | | | 392/416 |
| 2016/0126117 | A1* | 5/2016 | Sato | C30B 29/06 |
| | | | | 165/80.5 |
| 2017/0283947 | A1* | 10/2017 | Rasheed | C23C 16/509 |
| 2018/0033668 | A1* | 2/2018 | Tsuchida | H01L 21/6833 |
| 2019/0263724 | A1* | 8/2019 | Mitsuya | H01L 21/67103 |

FOREIGN PATENT DOCUMENTS

| | | | | |
|---|---|---|---|---|
| JP | 2003-142564 | A | | 5/2003 |
| JP | 2003142564 | A * | 5/2003 | |
| JP | 3596127 | B2 * | 12/2004 | |
| JP | 2008-004926 | A | | 1/2008 |
| JP | 2009141204 | A * | 6/2009 | |
| JP | 2017-103325 | A | | 6/2017 |
| KR | 20170064469 | A * | 6/2017 | |
| TW | 201708602 | A * | 3/2017 | ....... C23C 16/45544 |
| WO | WO-2012039453 | A1 * | 3/2012 | ............. G01K 13/00 |

* cited by examiner

HEATER AND HEATER SYSTEM

TECHNICAL FIELD

The present disclosure relates to a heater and a heater system.

BACKGROUND ART

Known in the art is a heater used in a semiconductor manufacturing apparatus or the like (for example, Patent Literature 1). Such a heater includes a heater plate. The heater plate has a plate-shaped base made of ceramic and a resistance heating element extending within the base along the upper surface of the base. Further, the heater plate heats a wafer placed on the upper surface of the base with heat generated by the resistance heating element.

Among such heaters, one in which a flow path is formed in the heater plate is known (see the section on technical problem in Patent Literature 1). Patent Literature 1 proposes forming a space instead of the flow path between the heater plate and a support member on which the heater plate is placed.

CITATION LIST

Patent Literature

Patent Literature 1: Japanese Patent Publication No. 2003-142564

SUMMARY OF INVENTION

A heater according to one embodiment of the present disclosure includes an insulating base, a resistance heating element, and a hollow member. The base includes a first main surface and a second main surface on a back of the first main surface. The resistance heating element extends inside the base along the first main surface and the second main surface. The hollow member includes a first plate-shaped part laid over the second main surface, a second plate-shaped part facing the first plate-shaped part through a space, and a side surface part surrounding the space from an outside in a planar direction of the first plate-shaped part and the second plate-shaped part.

A heater system according to one aspect of the present disclosure includes the above heater and a power supply unit that supplies power to the resistance heating element.

DESCRIPTION OF EMBODIMENTS

Figure 1:
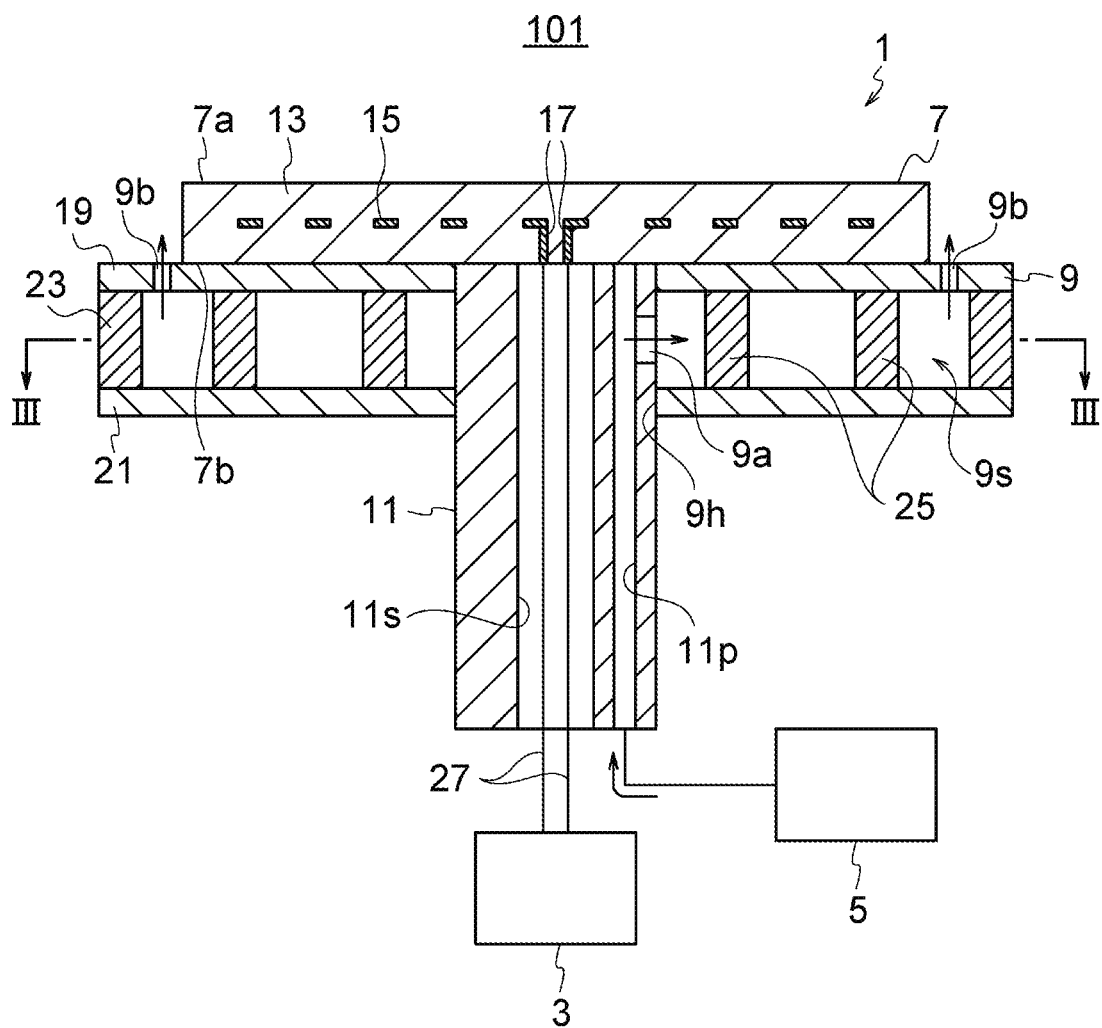
FIG. 1 is a schematic cross-sectional view showing the constitution of the heater system according to a first embodiment.

Below, heaters according to embodiments of the present disclosure will be described with reference to the drawings. However, the drawings referred to below are schematic ones for convenience of explanation. Accordingly, details may be omitted. Further, the dimensional ratios do not necessarily match the actual ones. Further, the heater may further include well-known components not shown in the drawings.

First Embodiment

Heater System

Figure 2:
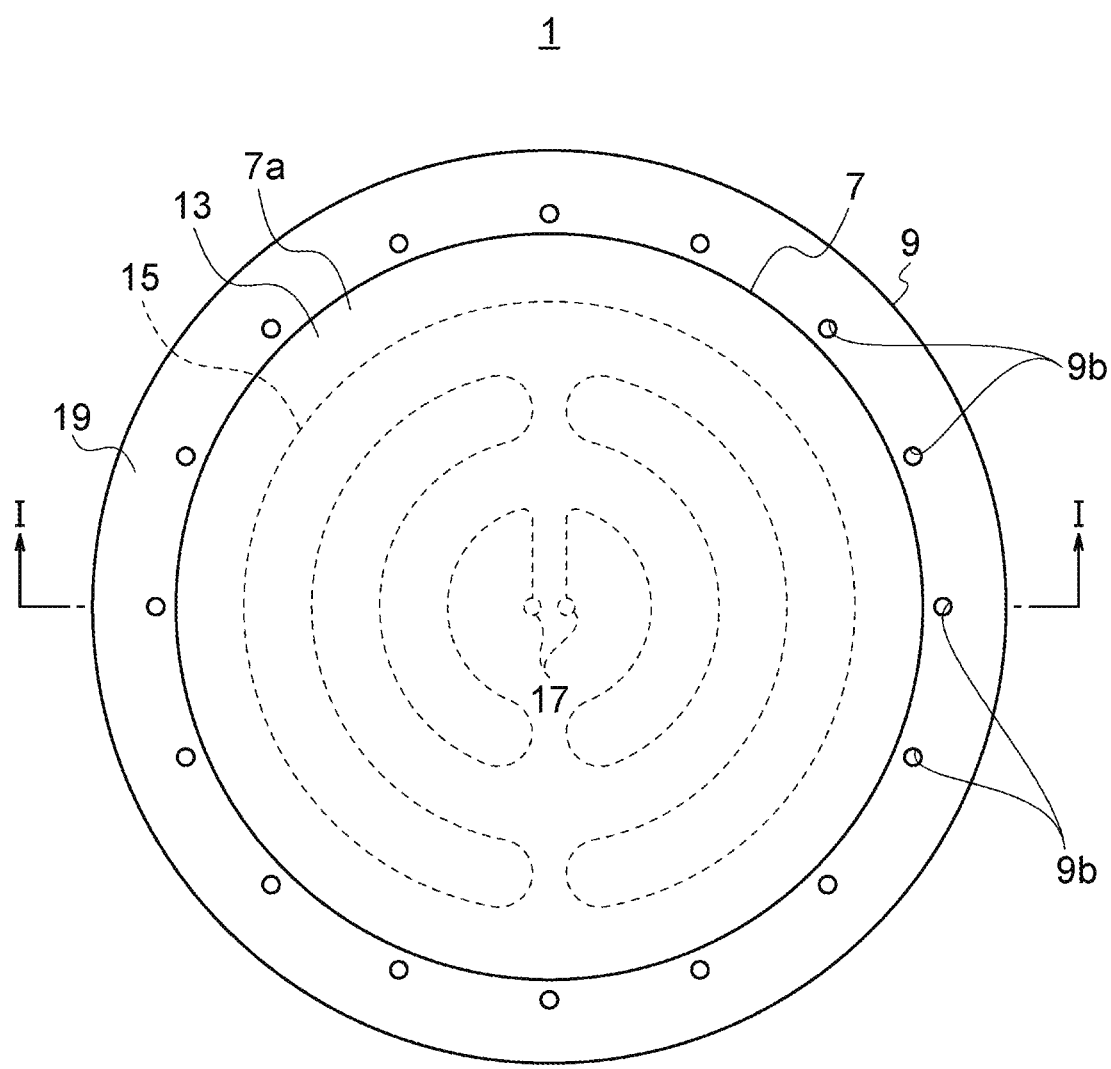
FIG. 2 is a plan view of the heater which the heater system of FIG. 1 contains.
Figure 3:
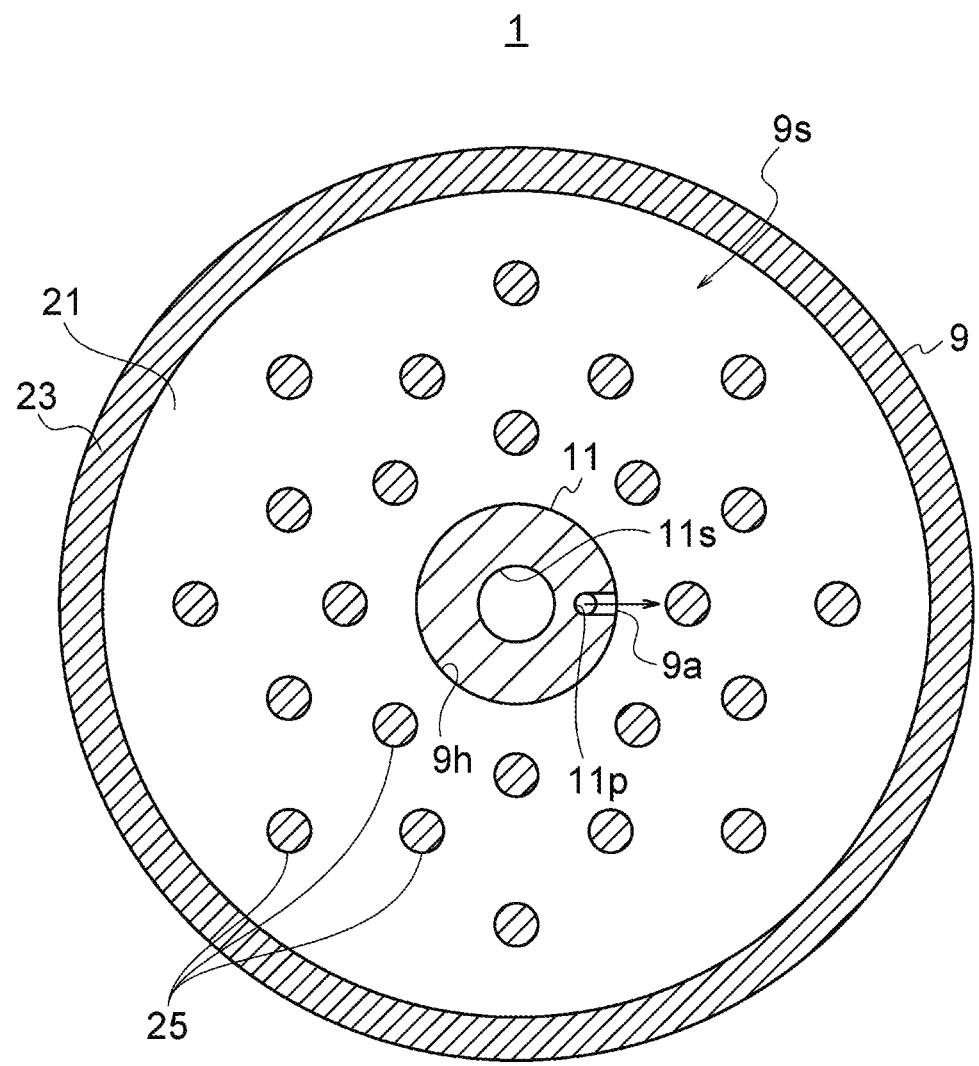
FIG. 3 is a cross-sectional drawing along the line of FIG. 1.

FIG. 1 is schematic cross-sectional view which shows the constitution of the heater system 101 according to an embodiment. FIG. 2 is a plan view of the heater 1 which the heater system 101 contains. FIG. 3 is a cross-sectional view taken along the line in FIG. 1. Note that FIG. 1 corresponds to a cross-sectional view taken along the line I-I of FIG. 2.

Note that the heater 1 does not necessarily have to be used with the upper side in FIG. 1 as the actual upper side. Below, for convenience, terms such as the upper surface and the lower surface may be used assuming that the upper side in FIG. 1 is the actual upper side. Further, unless otherwise noted, when simply referred to as a plan view, it means viewed from above in FIG. 1.

The heater system 101 includes a heater 1, a power supply unit 3 (FIG. 1) that supplies power to the heater 1, and a gas supply unit 5 (FIG. 1) that supplies gas to the heater 1. The heater 1 and the power supply unit 3 are connected by wiring members 27 (FIG. 1).

Heater

The heater 1 includes, for example, a substantially plate-shaped (disk-shaped in the illustrated example) heater plate 7, a hollow member 9 that is laid over the lower surface of the heater plate 7, and a pipe 11 (FIG. 1) extending downward from the formers.

A wafer (not shown) as an example of a heating object is placed on (laid over) the upper surface 7a of the heater plate 7. The heater plate 7 directly contributes to the heating of the wafer. The hollow member 9 constitutes a space through which fluid flows. The pipe 11 for example contributes to the support of the heater plate 7 (and the hollow member 9) and the protection of the wiring members 27. Note that the heater may be defined only by the heater plate 7 and the hollow member 9 excluding the pipe 11.

Heater Plate

The upper surface 7a and the lower surface 7b of the heater plate 7 are, for example, generally flat. The planar shape and various dimensions of the heater plate 7 may be appropriately set in consideration of the shape and dimensions of the heating object. For example, the planar shape is a circle (illustrated example) or a polygon (for example, a rectangle). As an example of the dimensions, the diameter is 20 cm to 35 cm, and the thickness is 5 mm to 30 mm.

The heater plate 7 includes, for example, an insulating base 13, a resistance heating element 15 embedded in the base 13, and a terminal 17 for supplying power to the resistance heating element 15. Note that, in FIG. 2, the resistance heating element 15 and the terminal 17 that are not visible in the plan view are also indicated by dotted lines. When a current flows through the resistance heating element 15, heat is generated in accordance with Joule's law and in turn the wafer placed on the upper surface 7a of the base 13 is heated.

The outer shape of the base 13 constitutes the outer shape of the heater plate 7. Therefore, the description relating to the shape and dimensions of the heater plate 7 described above may be regarded as the description of the outer shape and dimensions of the base 13 as they are. The material of the base 13 is ceramic, for example. The ceramic is, for example, a sintered body mainly comprised of aluminum nitride (AlN), aluminum oxide ($Al_2O_3$), silicon carbide (SiC), silicon nitride ($Si_3N_4$), and the like.

The resistance heating element 15 extends along (for example, parallel to) the upper surface 7a and the lower surface 7b of the base 13. Further, the resistance heating element 15 extends, for example, over substantially the entire surface of the base 13 in a plan view.

The specific pattern (path) of the resistance heating element 15 in a plan view may be made an appropriate one. For example, only one resistance heating element 15 is provided in the heater plate 7 and extends from one end to the other end without intersecting itself. Further, in the illustrated example, the resistance heating element 15 extends (in a meandering shape) so as to move back and forth in the circumferential direction in each region obtained by dividing the heater plate 7 into two. In addition, for example, the resistance heating element 15 may extend in a spiral shape or may extend so as to reciprocate linearly in one radial direction.

The shape of the resistance heating element 15 when viewed locally may also be made an appropriate one. For example, the resistance heating element 15 may be a layered conductor parallel to the upper surface 7a and the lower surface 7b, may be a coil shape (spring shape) wound around the above path, or may be a shape formed into a mesh. The dimensions in the different types of shapes may be appropriately set.

The material of the resistance heating element 15 is a conductor (for example, metal) that generates heat when a current flows. The conductor may be appropriately selected and is, for example, tungsten (W), molybdenum (Mo), platinum (Pt), indium (In), or an alloy containing these as a main component. Further, the material of the resistance heating element 15 may be obtained by firing a conductive paste containing the metal as described above. That is, the material of the resistance heating element 15 may include a glass powder and/or ceramic powder or other additive (inorganic insulator from another viewpoint).

Terminals 17 are, for example, connected to the two ends of the resistance heating element 15 in the length direction, and exposed from the lower surface 7b through the part of the base 13 on the lower surface 7b side at the positions of the two ends. Due to this, electric power can be supplied to the resistance heating element 15 from the outside of the heater plate 7. The pair of terminals 17 (two ends of the resistance heating element 15) are located at the center side of the heater plate 7, for example.

Hollow Member

The hollow member 9 is a member constituting a space 9s through which a fluid flows. The space 9s communicates with the outside of the hollow member 9 through the inlet 9a and the outlets 9b. The fluid is, for example, a gas. The gas functions, for example, as a purge gas that is replaced with a gas around the wafer (for example, a process gas) and/or as a heat transfer medium (backside gas) that contributes to the soaking of the wafer (heater plate 7). As such a gas, for example, an inert gas, helium, nitrogen, argon, or an appropriate mixed gas containing these may be used.

The hollow member 9 is generally plate-shaped in its appearance. That is, the hollow member 9 has a planar upper surface and lower surface that are parallel to each other. The heater plate 7 is laid over the upper surface of the hollow member 9. The hollow member 9 is, for example, wider than the heater plate 7 in a plan view, and the outer edge of the hollow member 9 is located outside the outer edge of the heater plate 7.

The planar shape of the hollow member 9 may be appropriately set. For example, in the plan view, the shape of the outer edge of the hollow member 9 is substantially the same as the shape of the outer edge of the heater plate 7. That is, the outer edge of the hollow member 9 extends substantially parallel to the outer edge of the heater plate 7 (separated by a certain distance). In the illustrated example, the planar shape of the hollow member 9 is circular corresponding to the circular heater plate 7. However, the shape of the outer edge of the hollow member 9 may be completely different from the planar shape of the heater plate 7. In the present embodiment, the hollow member 9 has a hole 9h through which the pipe 11 is inserted, in the center.

The hollow member 9 includes, for example, a first plate-shaped part 19 and a second plate-shaped part 21 that face each other across spaced apart, and a side surface part 23 that surrounds a gap between these plate-shaped parts from the outside in the planar direction of the plate-shaped parts. Due to this, the space 9s is constituted. The center side of the space 9s is closed by a pipe 11, for example. The hollow member 9 has a plurality of connecting parts 25 that connect the first plate-shaped part 19 and the second plate-shaped part 21. The plurality of connecting parts 25 contribute to heat transfer between the first plate-shaped part 19 and the second plate-shaped part 21, for example.

Note that, in FIG. 1, the first plate-shaped part 19, the second plate-shaped part 21, the side surface part 23, the connecting parts 25, and the pipe 11 are shown by boundary lines with each other and are given mutually different hatching. However, part or all of these portions may be integrally formed. The boundaries between the portions need not be able to be identified from the viewpoint of the material. In other words, each portion may be identified only from the viewpoint of shape. More specifically explained, the boundaries between the portions and the boundaries from the viewpoint of material do not necessarily need to match (of course, they may match).

The first plate-shaped part 19 constitutes the upper surface (the surface on the heater plate 7 side) of the hollow member 9. The second plate-shaped part 21 constitutes the lower surface of the hollow member 9. These plate-shaped parts are, for example, roughly flat plate shape. The thickness may be appropriately set from various viewpoints such as heat conductivity and strength. The planar shape and size of the first plate-shaped part 19 and the second plate-shaped part 21 are, for example, generally the same as each other. The description of the shape and size of the hollow member 9 in a plan view (described above) may be made the description of the shape and size of these plate-shaped parts in a plan view.

The side surface part 23, for example, extends along the outer edges of the first plate-shaped part 19 and the second plate-shaped part 21 in a plan view. The shape of the lateral cross-section (cross-section orthogonal to the outer edge mentioned above) of the side surface part 23 is, for example, substantially constant over the outer edge mentioned above. Further, the shape of the cross-section may be appropriately set. For example, it is roughly rectangular. An aspect ratio of the shape may be appropriately set. In the illustrated example, the side surface part 23 has a height larger than the width and is drawn in a wall shape. However, the side surface part 23 may have a width greater than or equal to the height (may be a layer shape).

The connecting parts 25 are interposed between the first plate-shaped part 19 and the second plate-shaped part 21. Further, the connecting parts 25 are distributed in the space 9s in a plan view. Note that, when referring to the connecting parts 25 being distributed, it indicates that the two or more connecting parts 25 exist separated from each other, for example.

The number and arrangement positions of the plurality of connecting parts 25 may be appropriately set. For example, the plurality of connecting parts 25 may be regularly arranged or randomly arranged. When regularly arranged, for example, the plurality of connecting parts 25 may be arranged along a plurality of concentric circles, may be arranged radially, or may be arranged vertically and horizontally. In the arrangement, the pitch may or may not be constant. Further, for example, the density of the plurality of connecting parts 25 may be substantially constant in the space 9s, or may be different between a plurality of regions. For example, the density may be different between the inner peripheral side and the outer peripheral side, or the density between the inner peripheral side and the outer peripheral side may be higher compared with the inner peripheral side and the outer peripheral side.

The shapes and/or sizes of the plurality of connecting parts 25 may be the same (example shown in the drawing) or may be different from each other. Note that the density mentioned above may be obtained by dividing the area× number of the connecting parts 25 in a plan view by the area of the region or may be obtained by dividing the number of connecting parts 25 by the area of the region.

The shapes of the connecting parts 25 may be made appropriate shapes. For example, the shapes of the connecting parts 25 may be right column shapes or may be frustum shapes or may be shapes with larger or smaller areas of lateral cross-sections (cross-sections parallel to the first plate-shaped part 19) at the center in the height direction. Further, the shapes of the lateral cross-sections of the connecting parts 25 may be circles (example shown in the figure) or polygons (for example, rectangles).

The dimensions of the connecting parts 25 may also be appropriately set. The diameters of the connecting parts 25 (the maximum diameters or the minimum diameters when the lateral cross-sections are not circular) may be longer than, may be equal to, or may be shorter than (example shown in the figure) the heights of the connecting parts 25 (distance between the first plate-shaped part 19 and the second plate-shaped part 21).

The material of the hollow member 9 may be an organic material, may be an inorganic material, may be a conductive material, or may be an insulating material. For example, the hollow member 9 is made of a ceramic. As a specific material of the ceramic, for example, those described in the description of the base 13 (AlN or the like) may be used. The ceramic constituting the hollow member 9 may be the same as or may be different from the ceramic constituting the base 13 of the heater plate 7. Further, the hollow member 9 may be entirely made of the same material, or may be in some parts (for example, the first plate-shaped part 19, the second plate-shaped part 21, the side surface part 23, or the connecting parts 25) made of a material different from other parts. The surface may be coated.

Further, part or all of the hollow member 9 may be a material having a thermal conductivity higher than, equal to, or a lower than the base 13, the pipe 11, or the fluid (for example, gas) in the space 9s. In the explanation of the present embodiment, the case where the thermal conductivity of the material of the hollow member 9 is higher than the thermal conductivity of the fluid in the space 9s is sometimes taken as an example.

Pipe

The pipe 11 has a hollow shape in which upper and lower sides (both sides in the axial direction) are open. From another viewpoint, the pipe 11 has a space 11s running vertically. The shape of the horizontal cross-section (cross-section orthogonal to the axial direction) and the vertical cross-section (cross-section parallel to the axial direction) of the pipe 11 may be appropriately set. In the illustrated example, the pipe 11 has a circular cylindrical shape having a constant diameter with respect to the position in the axial direction. Of course, the diameter of the pipe 11 may be different depending on the position in the height direction. Further, the specific value of the dimension of the pipe 11 may be set appropriately.

As described above, the hollow member 9 has a hole 9h on the center side in the plane direction. The pipe 11 is inserted into the hole 9h. Further, the gap between the first plate-shaped part 19 and the second plate-shaped part 21 is closed by the outer peripheral surface of the pipe 11 from the hole 9h side.

The pipe 11 is formed with, separate from the space 11s, a flow path 11p that connects the gas supply unit 5 and the space 9s of the hollow member 9. The flow path 11p extends along the axial direction of the pipe 11 (for example, in parallel with it), for example. The lower end of the flow path 11p may open to the outside at an appropriate position of the pipe 11. For example, it is open on the lower end face of the pipe 11. Further, the flow path 11p, for example, communicates with the space 9s by forming an inlet 9a in a part of the pipe 11 inserted into the hollow member 9. Note that the inlet 9a may also be regarded as a part of the flow path 11p.

In the figure, only one flow path 11p is shown, but two or more flow paths 11p may be provided and open to the space 9s separately from each other. Further, the flow path 11p may be branched into a plurality of paths in the process of heading from the gas supply unit 5 toward the space 9s and communicate with the space 9s at a plurality of positions. In the illustrated example, the flow path 11p passes through the pipe 11 to the upper end beyond the inlet 9a, but may only extend to just the inlet 9a.

The pipe 11 may be made of an insulating material such as a ceramic or may be made of a metal (conductive material). As specific materials of the ceramic, for example, those described in the explanation of the base 13 (AlN or the like) may be used. Further, the material of the pipe 11 may be the same as or may be different from the material of the base 13.

Space, Inlet, and Outlet

As can be understood from the above explanation, the space 9s, for example, basically (ignoring the plurality of connecting parts 25) extends continuously from the center side (the pipe 11 side) of the hollow member 9 in the plane direction to the outside in the plane direction in all directions. From another viewpoint, the space 9s is a thin annular space. The space 9s extends to the outside from the heater plate 7 (base 13) in plan perspective, for example. From another viewpoint, the space 9s extends to the outside from the range of placement of the resistance heating element 15.

The inlet 9a, for example, as described above, is configured by an opening (may be a notch) located in a part of the pipe 11 that is inserted through the hollow member 9. That is, the inlet 9a is open on a wall surface on the center side in the planar direction of the hollow member 9 toward the outside in the planar direction of the hollow member 9. The inlet 9a communicates with the flow path 11p of the pipe 11 as described above and communicates with the outside of the hollow member 9 via the flow path 11p. As described above, only one inlet 9a may be formed or a plurality may be provided. The plurality of inlets 9a for example may be arranged in the circumferential direction of the pipe 11 (the wall surface on the center side of the hollow member 9) at a constant pitch.

The outlet 9b, for example, is configured by an opening in the first plate-shaped part 19 located at the outside from the heater plate 7. From another point of view, the outlet 9b is located at a position adjacent to the outer peripheral surface of the heater plate 7 and opens toward a direction which the upper surface 7a of the heater plate 7 faces. "Adjacent" referred to here means that the distance between the outer peripheral surface of the heater plate 7 and the outlet 9b is relatively short. For example, the distance is 2 times or less, or 1 time or less of the diameter of the outlet 9b (if not circular, for example, the largest diameter) or the thickness of the heater plate 7. A plurality of outlets 9b are provided, for example, and are arranged along the outer edge of the heater plate 7 (from another viewpoint, the outer edge of the hollow member 9). The pitch of the arrangement is, for example, constant. The shapes and sizes of the outlets 9b in a plan view may be appropriately set. Further, the outlets 9b may mutually be connected.

Wiring Members

The wiring members 27 are inserted into the space 11s of the pipe 11. In planar view, a plurality of terminals 17 are exposed from the base 13 in a region of the heater plate 7 exposed in the space 11s of the pipe 11. Further, the wiring members 27 are connected at single ends to the plurality of terminals 17, thereby connecting the resistance heating element 15 and the power supply unit 3.

The plurality of wiring members 27 may be flexible conductors, may be rod-shaped members having no flexibility, or may be a combination thereof. Further, the plurality of flexible conductors may be bundled to form one cable or need not be bundled. Further, the wiring members 27 and the terminals 17 may be appropriately connected. For example, the two may be joined by a conductive joining material. Further, for example, the two may be screwed together by forming a male screw part at one and a female screw part on the other.

Power Supply Unit and Gas Supply Unit

The power supply unit 3, for example, although not particularly illustrated, includes a power supply circuit and a computer etc., converts electric power from the commercial power supply to an AC power and/or DC power of an appropriate voltage, and supply the result to the heater 1 (the plurality of terminals 17). The power supply unit 3 (control unit thereof) may perform feedback control of the temperature of the heater 1 based on a temperature detected by a not shown temperature sensor provided in the heater 1.

Note that the temperature sensor is, for example, a thermocouple or a thermistor. The resistance heating element 15 may also be used as a thermistor. The position of the temperature sensor may be made an appropriate position. For example, the thermocouple may be disposed in the space 11s of the pipe 11 and at least the tip thereof may be buried in the heater plate 7.

The gas supply unit 5, for example, although not particularly illustrated, is configured including a tank (cylinder) that holds gas in a pressurized state, a valve that controls the flow rate of the gas from the tank, and a control device that controls the valve. Note that the control device of the gas supply unit 5 may be integrated with the control device of the power supply unit 3.

Method for Manufacturing Heater

In the method for manufacturing the heater 1, for example, the heater plate 7, the hollow member 9, and the pipe 11 are fabricated separately from each other. Thereafter, these members are fixed to each other. Due to this, the heater 1 is produced. Note that the heater plate 7 and the pipe 11 may be fabricated together, or the hollow member 9 and the pipe 11 may be fabricated together.

The method for fabricating the heater plate 7, for example, may be the same as various known methods. For example, in the method of fabricating the heater plate 7, first, a plurality of ceramic green sheets constituting the base 13 are prepared by a doctor blade method or the like. Next, as necessary, processing for forming a groove or a hole in which the resistance heating element 15 and the terminals 17 are arranged (for example, cutting or pressing) is performed. Next, a material (for example, a conductive paste) for forming the resistance heating element 15 is disposed on any ceramic green sheet. Further, a plurality of ceramic green sheets are laminated and fired. Other than this, for example, the heater plate 7 may be formed by the hot press method.

The method of fabricating the pipe 11 for example may also be the same as various known methods. For example, a ceramic pipe 11 may be fabricated by an extrusion molding method, an injection molding method, or a hot pressing method. Further, a ceramic green sheet formed by a doctor blade method or the like may be wound around a shaft member and fired. Alternatively, molded parts fabricated by the well-known molding method may be cut and joined to fabricate the pipe 11. The flow path 11p may be formed together with the space 11s by a mold, or may be formed by cutting using a drill or the like after the pipe 11 is molded.

The hollow member 9 may also be fabricated following the method of fabrication of the heater plate 7 and the pipe 11. For example, a ceramic green sheet for forming the first plate-shaped part 19, a ceramic green sheet for forming the side surface part 23, and a ceramic green sheet for forming the second plate-shaped part 21 are prepared by the doctor blade method or the like. The side surface part 23 for example is shaped by the punching out a ceramic green sheet. Note that, the side surface part 23 may also be fabricated by an extrusion molding method, an injection molding method, or a hot press method.

Further, in parallel with the above, a material (for example, ceramic) for forming a plurality of connecting parts 25 is formed by punching ceramic green sheets, extrusion molding, injection molding, or hot pressing. Next, the material for forming the plurality of connecting parts 25 is arranged at the surface of the ceramic green sheet for forming the first plate-shaped part 19 at the second plate-shaped part 21 side or the surface of the ceramic green sheet for forming the second plate-shaped part 21 at the first plate-shaped part 19 side.

Thereafter, the ceramic green sheets used as the first plate-shaped part 19, the side surface part 23, and the second plate-shaped part 21 are stacked and these are fired.

Note that the plurality of connecting parts 25 (and the side surface part 23) can be formed as projections by cutting the ceramic green sheet for forming the first plate-shaped part 19 or the second plate-shaped part 21. Further, such projections may be formed by shaping the first plate-shaped part 19 or the second plate-shaped part 21 by the injection molding method, the lamination method, or the hot press method.

Fastening of Members

Figure 4A:
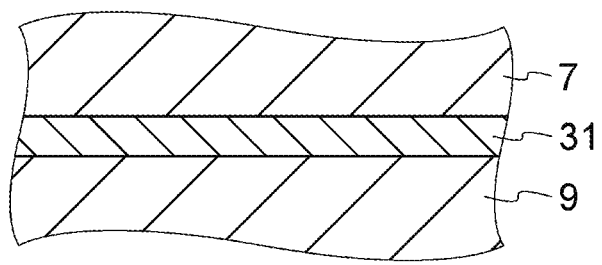
FIG. 4A, FIG. 4B, and FIG. 4C are schematic cross-sectional views showing various examples of the mode of joining a heater plate and a hollow member in the heater of FIG. 2.
Figure 4B:
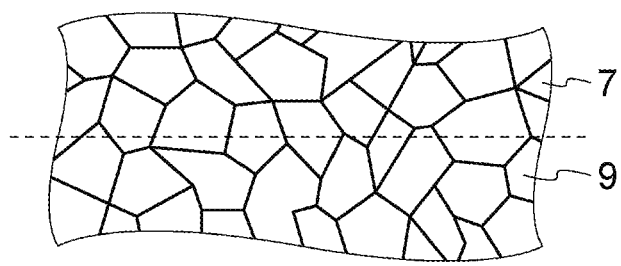
Figure 4C:
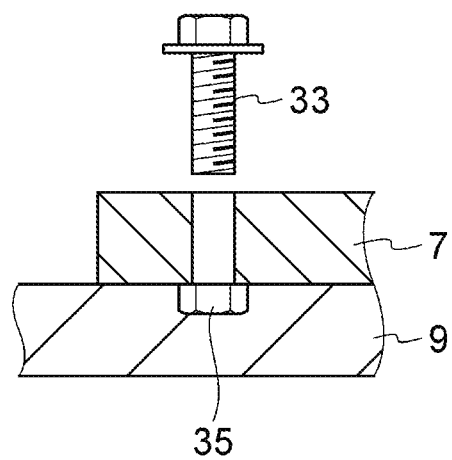

FIGS. 4A to 4C are schematic cross-sectional views showing various examples of the mode of joining the heater plate 7 and the hollow member 9.

As shown in FIG. 4A, the heater plate 7 and the hollow member 9 may be joined by an adhesive 31 (adhesive layer) interposed between the two. The adhesive 31 may be an organic material, may be an inorganic material, may be a conductive material, or may be an insulating material. Specifically, as the adhesive 31, for example, a glass-based one may be used. That is, the heater plate 7 and the hollow member 9 may be glass-bonded.

Further, as shown in FIG. 4B, the heater plate 7 and the hollow member 9 may be directly joined without interposing an adhesive material between the two. For this joining operation, for example, solid phase bonding may be used. For example, diffusion bonding may be used as the solid phase bonding. In diffusion bonding, the heater plate 7 and the hollow member 9 are bonded by being heated and pressed.

In FIG. 4B, grains of ceramic are schematically shown by polygons. A state in which the interface between the heater plate 7 and the hollow member 9 has disappeared is shown. Note that diffusion bonding includes not only bonding in which the heater plate 7 and the hollow member 9 are brought into direct contact but also bonding in which a material for promoting the bonding is disposed between the two. The material may be in a solid phase or may be in a liquid phase during bonding.

Further, as shown in FIG. 4C, the heater plate 7 and the hollow member 9 may be coupled mechanically. FIG. 4C illustrates a mode in which the bolt 33 inserted through the heater plate 7 is screwed into the nut 35 embedded in the hollow member 9 so that the heater plate 7 and the hollow member 9 are fixed. Note that, this example is an example in which the heater plate 7 and the hollow member 9 are detachably fixed from another viewpoint.

Note that although not particularly illustrated, in the same way as fastening of the heater plate 7 and the hollow member 9, fastening of the heater plate 7 and the pipe 11 may be one via an adhesive (for example, glass), phase bonding, or mechanical coupling.

As described above, in the present embodiment, the heater 1 includes the insulating base 13, the resistance heating element 15, and the hollow member 9. The base 13 has an upper surface 7a and a lower surface 7b. The resistance heating element 15 extends in the base 13 along the upper surface 7a and the lower surface 7b. The hollow member 9 includes a first plate-shaped part 19 that overlaps the lower surface 7b, a second plate-shaped part 21 that faces the first plate-shaped part 19 through a space 9s, and a side surface part 23 surrounding a space 9s from the outside of the planar direction of the first plate-shaped shape 19 and the second plate-shaped part 21.

Accordingly, the base 13 (heater plate 7) is not used as a member forming the space 9s. As a result, for example, the heater plate 7 can be made a general-purpose one and the hollow member 9 can be made one adapted to the system in which the heater 1 is incorporated. Conversely, the hollow member 9 can be made a general-purpose member and the heater plate 7 can be made one adapted to the system. That is, the independence of the design of the heater plate 7 and the design of the hollow member 9 is improved. As a result, the design is facilitated. From another viewpoint, various variations of the heater can be realized at low cost by changing the combination of the heater plate 7 and the hollow member 9.

Further, in the present embodiment, the hollow member 9 has a plurality of connecting parts 25. The plurality of connecting parts 25 are located between the first plate-shaped part 19 and the second plate-shaped part 21 and connected to the first plate-shaped part 19 and the second plate-shaped part 21 and are distributed in the space 9s in a plan view of the upper surface 7a.

Therefore, the heat transfer paths from the first plate-shaped part 19 to the second plate-shaped part 21 are distributed in the space 9s. As a result, for example, it is make easy to equalize the temperature of the first plate-shaped part 19. For example, on the center side or the outer peripheral side of the first plate-shaped part 19, the heat of the first plate-shaped part 19 easily escapes to the second plate-shaped part 21 via the pipe 11 or the side surface part 23. As a result, the first plate-shaped part 19 is liable to fall in temperature at the central side or the outer peripheral side as compared with the middle region. However, the heat of the intermediate region can be released to the second plate-shaped part 21 by the plurality of connecting parts 25, and the temperature difference in the first plate-shaped part 19 can be eased. In turn, it is easy to make the temperature of the heater plate 7 uniform and make the temperature of the wafer uniform.

Further, in the present embodiment, the space 9s extends from a region overlapping the base 13 of the heater plate 7 to the outside of the base 13 in a plan view of the upper surface 7a of the heater plate 7.

Therefore, for example, the effect of equalization of temperature by the fluid in the space 9s extends to the outer edge of the heater plate 7. As a result, for example, it is made easy to make the temperature of the wafer uniform. Note that, it is impossible or extremely difficult to obtain the above configuration in a mode like in the past in which a space is formed in the heater plate or a recess that becomes a space is closed by the heater plate.

Further, in this embodiment, the hollow member 9 has the inlet 9a and the outlets 9b which connect the inside of the space 9s and the outside of the space 9s. The outlets 9b are located outside the base 13 of the heater plate 7 in a plan view of the upper surface 7a of the heater plate 7.

Therefore, for example, a flow different from the case where the outlets are provided at the upper surface 7a of the heater plate 7 can be realized. For example, purge gas can be ejected in a wider range. As a result, for example, depending on the arrangement of the heater 1 and the chamber etc., the gas around the wafer is quickly replaced. Note that, in a mode like the past in which a space is formed in the heater plate or a recess forming a space is closed by the heater plate, it is impossible or extremely difficult to extend the space to the outside of the heater plate.

Further, in the present embodiment, the base 13 is an integrally formed member made of ceramic. The base 13 and the first plate-shaped part 19 may be fixed by an adhesive or solid phase bonding.

In this case, for example, the base 13 and the first plate-shaped part 19 can be made to closely contact each other to reduce the liability of a gap being formed at part between the two. If there is an air gap, for example, the heat transfer between the base 13 and the first plate-shaped part 19 is liable to vary, but such a liability is reduced. Further, when glass bonding is used, the adhesive layer can be used as a heat insulating layer.

Further, in the present embodiment, the base 13 and the hollow member 9 may also be fixed so that attachment or detachment is possible.

In this case, for example, the heater plate 7 and the hollow member 9 can be combined immediately before sale or immediately before use. As a result, for example, one of the heater plate 7 and the hollow member 9 can be made one adapted to a wafer processing apparatus, and the other can be made a general-purpose one. Further, changing the hollow member 9 become possible.

Further, in the present embodiment, the heater 1 may further include a pipe 11 that passes through the hollow member 9 in a direction orthogonal to the lower surface 7b of the heater plate 7 and is joined to the lower surface 7b.

In this case, for example, one of the hollow member 9 and the combination of the heater plate 7 and the pipe 11 can be made a general-purpose one, and the other can be made one suitable for a wafer processing apparatus. Compared to the occasion where the pipe 11 is needed, the hollow member 9 is rarely needed. Therefore, by combining the heater plate 7 and the pipe 11 in advance, various variations of the heater can be efficiently realized. This effect is particularly effective when the hollow member 9 and the base 13 are detachable as described above.

Second Embodiment

Below, a second embodiment according to the present disclosure will be explained. In the following explanation, for a configuration that is common with as or similar to a configuration explained in the first embodiment, the reference signs attached to the configuration of the first embodiment will be used and the illustration and explanation will sometimes be omitted. Note that, for a configuration corresponding to a configuration of the first embodiment, even when a reference sign different from that of the configuration of the first embodiment is attached, points not particularly noted may be considered to be the same as the configuration of the first embodiment.

Figure 5:
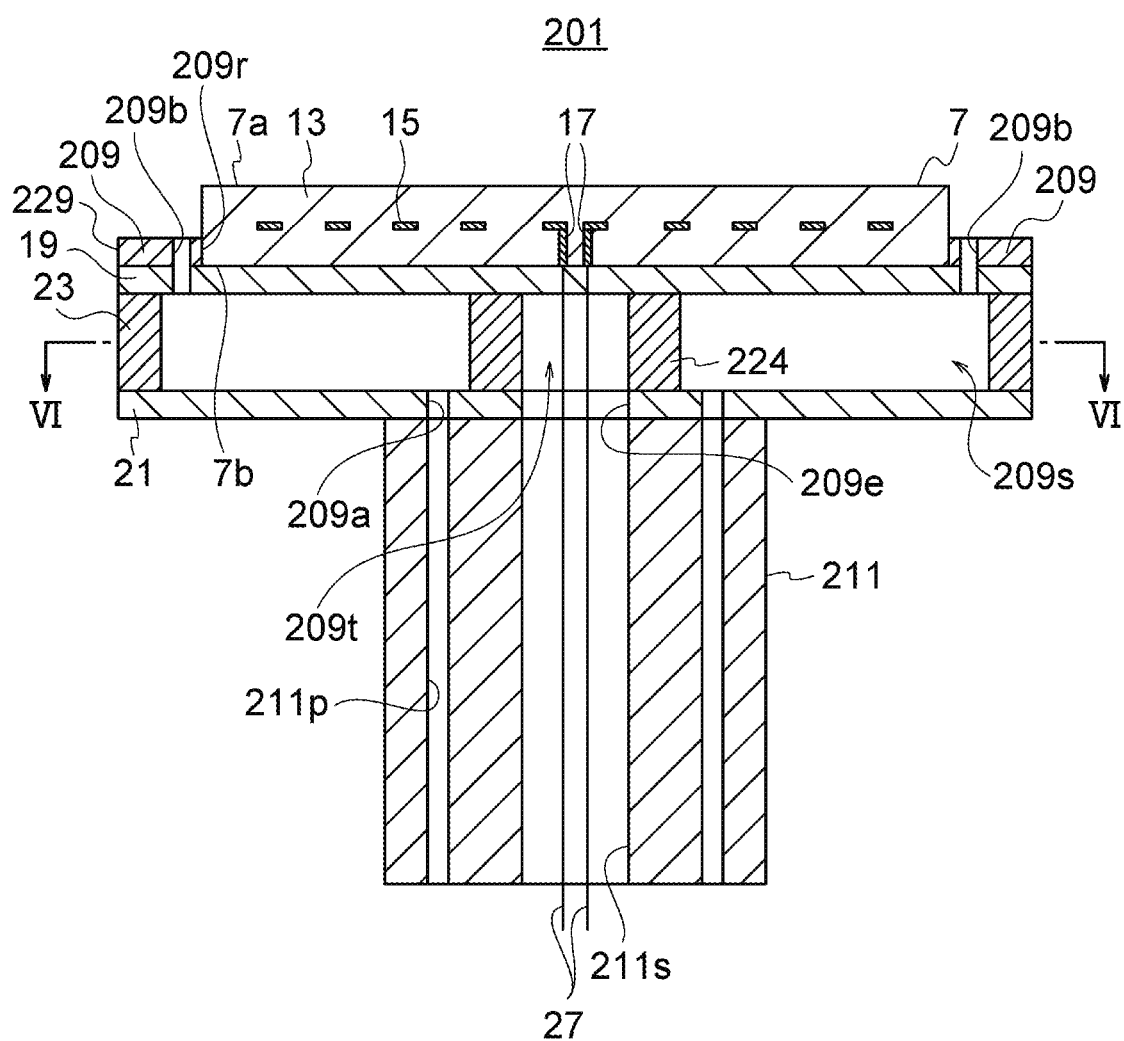
FIG. 5 is a cross-sectional view which shows the constitution of the heater according to a second embodiment.
Figure 6:
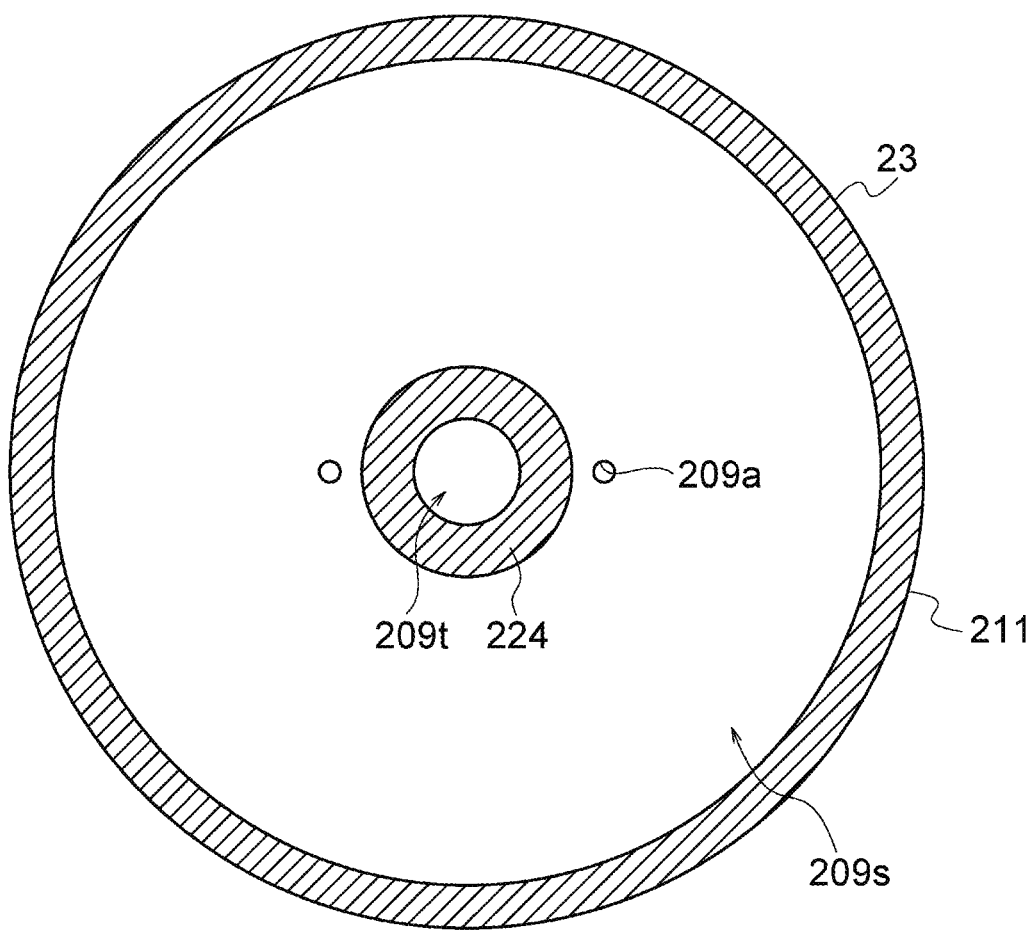
FIG. 6 is a cross-sectional view along the VI-VI line of FIG. 5.

FIG. 5 is a cross-sectional view illustrating the configuration of the heater 201 according to the second embodiment and corresponds to FIG. 1 of the first embodiment. FIG. 6 is a cross-sectional view taken along the line VI-VI in FIG. 5. Note that, although not particularly illustrated, in the same way as the first embodiment, the power supply unit 3 may be connected to the wiring members 27, and the gas supply unit 5 may be connected to the lower end of the flow path 211p.

In the first embodiment, the center side of the space 9s of the hollow member 9 is closed by the pipe 11 inserted through the hollow member 9. As opposed to this, in the heater 201, the center side of the outside space 209s corresponding to the space 9s is closed by the inner wall 224 of the hollow member 209. In other words, the hollow member 209 of the heater 201 has an inner wall 224 that partitions an inside of the hollow member 209 into an inner space 209t on the inner side in the plane direction and the outer space 209s on the outer side in the plane direction.

The outer space 209s, in the same way as the space 9s of the first embodiment, communicates with the outside of the hollow member 209 via the inlet 209a and the outlets 209b. The inner space 209t is a space corresponding to the upper end side part of the space 11s of the pipe 11 of the first embodiment and communicates with the outside through the space 211s of the pipe 211.

In a plan view of the heater plate 7, the shape and size of the inner wall 224 may be appropriately set. For example, in a plan view, the shape of the inner wall 224 is a shape with an inner surface substantially coinciding with the inner surface of the upper end side part of the pipe 211 and is circular in the illustrated example. The shape of the transversal cross-section of the inner wall 224 (cross-section shown in FIG. 5) is, for example, substantially constant over the entire circumference in a plan view. Further, the shape of the cross-section may be appropriately set. For example, it is substantially rectangular. An aspect ratio of the shape may be appropriately set. In the illustrated example, the inner wall 224 has a height larger than the width and is drawn in a wall shape. However, the inner wall 224 may have a width greater than or equal to the height (may be layer shape). The material of the inner wall 224 and the manufacturing method of the inner wall 224 may be the same as those of the side surface part 23 and/or the connecting parts 25.

The pipe 211, for example, unlike the pipe 11 of the first embodiment, is not inserted into the hollow member 9 and is fixed to the lower surface (second plate-shaped part 21) of the hollow member 209. In the same way as the method of fixing the heater plate 7 and the hollow member 9 or the pipe 11 explained in the first embodiment, the fixing method of the pipe 211 and the hollow member 209 may be using an adhesive interposed between the two, may be one using solid phase bonding, or may be one using mechanical coupling.

The second plate-shaped part 21 is formed with an opening 209e at a position overlapping the space 211s of the pipe 211. Due to this, the inner space 209t communicates with the outside of the heater 1 through the space 211s (for example, a space in a not shown chamber that houses the heater 201). In a plan view, the shape and size of the opening 209e may be the same as or may be different from the shape and size of the upper end of the space 211s. If they are different, in the sizes of the two, either may be larger. In the illustrated example, the shape and size of the opening 209e are equal to the shape and size of the upper end of the space 211s and are circular.

Note that, since the pipe 211 is not directly fixed to the heater plate 7, unlike the first embodiment, the first plate-shaped part 19 is not formed with a hole for inserting the pipe 211. However, the first plate-shaped part 19 is formed with holes for exposing the terminals 17 to the inner space 209t and the space 211s of the pipe 211. Note that, the first plate-shaped part 19 may have a comparatively wide hole similarly to first embodiment.

In the same way as the pipe 11, the pipe 211 has a flow path 211p extending in the axial direction. An upper end of the flow path 211p is opened at, for example, the upper end face of the pipe 211. The second plate-shaped part 21 of the hollow member 209 has inlets 209a at positions which overlap with the upper end of the flow path 211p. Due to this, the outer space 209s is connected to the gas supply unit 5 (see FIG. 1) via the flow path 211p. The number, arrangement position, shape, size, and the like of the inlets 209a may be appropriately set. For example, the inlets 209a are arranged at an equal pitch around the inner wall 224 at positions adjacent to the inner wall 224. In the illustrated example, two inlets 209a are provided. "Adjacent" here means, for example, that the distances between the inner wall 224 and the inlets 209a are relatively short. For example, the distances are 2 times or less, or 1 time or less of the diameters of the inlets 209a (if not circular, for example, the maximum diameter) or height of the outer space 209s.

The hollow member 9 has a protrusion 229 that protrudes upward (the direction which the upper surface 7a of the heater plate 7 faces) from the first plate-shaped part 19 at a position that is outside of the heater plate 7 in a plan view. This protrusion 229 is formed in, for example, a ridge (from another viewpoint, annular) surrounding the heater plate 7. In another viewpoint, the hollow member 9 has a recess 209r that holds at least the part of the heater plate 7 on the lower surface 7b side.

The shape, size, and the like of the recess 209r (projection 229) may be appropriately set. For example, the recess 209r has a shape in which at least a part on the lower surface 7b side of the heater plate 7 is fit. That is, the shape and size of the recess 209r in a plan view are the same as those of the heater plate 7 and are circular in the illustrated example. The depth of the recess 209r (the height of the protrusion 229) is for example smaller than the thickness of the heater plate 7. However, the depth of the recess 209r may be equal to or greater than the thickness of the heater plate 7.

The shape and size of the transversal cross-section of the protrusion 229 (the cross-section shown in FIG. 5) may be appropriately set. For example, the shape of the horizontal cross-section of the protrusion 229 is a rectangle, and the height and the width thereof may be larger. In the example shown in the drawing, the width is larger than the height. Further, in the illustrated example, the outer edge of the protrusion 229 coincides with the outer edge of the hollow member 209. However, the outer edge of the protrusion 229 may also be located inside the outer edge of the hollow member 209.

The protrusion 229 is formed, for example, by stacking on a ceramic green sheet for forming the first plate-shaped part 19 a ceramic green sheet for forming the protrusion 229. Alternatively, the protrusion 229 and the first plate-shaped part 19 may be integrally formed from the beginning. For example, the protrusion 229 and the first plate-shaped part 19 may be formed by cutting a ceramic green sheet having a total thickness of the protrusion 229 and the first plate-shaped part 19 or may be molded together by injection molding and hot pressing.

The outlets 209b open to the outside of the hollow member 209 at the top surface of the protrusion 229, for example. Compared with the first embodiment, the outlets 209b become longer in the flow path direction (vertical direction) by amounts corresponding to the protruding amount of the protrusion 229 and have upper opening surfaces shifted upward. The outlets 209b, for example, extend in the flow path direction (vertical direction) with constant cross-sectional areas. However, the holes in the protrusions 229 and the holes in the first plate-shaped part 19 may also be different in diameter. Note that the number, positions, shapes, and the like of the outlets 209b in a plan view may be the same as those of the outlets 9b in the first embodiment.

Note that, in FIG. 5 and FIG. 6, the plurality of connecting parts 25 are not illustrated. However, in the same way as in the first embodiment, a plurality of connecting parts 25 may be provided. Further, the heater plate 7 and the hollow member 209, in the same way as in the first embodiment, may be fixed by an adhesive, solid phase bonding, or mechanically coupled (including detachably).

In the above second embodiment as well, in the same way as in the first embodiment, the hollow member 209 of the heater 201 includes the first plate-shaped part 19 that overlaps the lower surface 7b of the base 13 of the heater plate 7, a second plate-shaped part 21 facing the first plate-shaped part 19 via the outer space 209s, and a side surface part 23 surrounding the outer space 209s from the outside of the planar direction of the first plate-shaped part 19 and the second plate-shaped part 21. Therefore, the same effects as the first embodiment are exhibited. For example, design is facilitated.

Further, in the present embodiment, the hollow member 209 has a protrusion 229 that protrudes from the first plate-shaped part 19 in a direction which the upper surface 7a faces at a position that becomes the outside from the base 13 in a plan view of the upper surface 7a of the heater plate 7. The outlets 209b open to the outside at the top surface of protrusion 229.

Therefore, for example, the outlets 209b can be brought close to the wafer on the upper surface 7a. As a result, for example, the gas around the wafer can be quickly replaced with the purge gas. Further, the protrusion 229 can function as a positioning part for positioning the heater plate 7 and the hollow member 209. That is, the nozzle and the positioning part are used in common. Note that, it is impossible or extremely difficult to form the nozzle to be able to position the heater plate in a mode like in the past in which a space is formed in the heater plate or a recess that becomes a space is closed by the heater plate.

Further, in the present embodiment, the hollow member 209 has a recess 209r in which at least a part of the base 13 on the lower surface 7b side is accommodated.

Therefore, positioning of the base 13 with respect to the hollow member 209 is facilitated. Further, since the contact area of the hollow member 209 and the base substrate 13 increases, the two can be joined stronger and the heat exchange between the two can be facilitated.

Further, in the present embodiment, the hollow member 209 further has an inner wall 224 that is located between the first plate-shaped part 19 and the second plate-shaped part 21 and partitions the inside of the hollow member 209 to an inside space 209t inside a plane direction and an outside space 209s outside in the planar direction.

In this case, for example, the sealing of the outer space 209s is completed within the hollow member 209. That is, the influence of the fixing operation of the hollow member 209 and the pipe 211 and the like on the sealing property of the outer space 209s is reduced. As a result, for example, the accuracy of predicting the influence of the fluid on the processing of the wafer is increased, and the selection or replacement of the hollow member 209 is facilitated.

In the present embodiment, the heater 201 further includes a pipe 211 having one end joined to the second plate-shaped part 21.

In this case, for example, since the hollow member 209 is interposed between the heater plate 7 and the pipe 211, the heat of the heater plate 7 does not escape directly to the pipe 211. As a result, for example, it is easy to make the temperature of the heater plate 7 uniform. Further, for example, the hollow member 209 also contributes to relieving thermal stress between the heater plate 7 and the pipe 211. Further, for example, since the hollow member 209 and the pipe 211 are joined, it is easy to improve the sealing performance at the connecting parts between the flow path 211p and the inlet 209a. As a result, the above mentioned effect of completing sealing of the outside space 209s in the hollow member 209 is improved.

Modification of Outlets

In FIG. 1, as the outlets 9b, ones in which shapes and areas of the horizontal cross-sections (cross-sections intersecting the direction of flow. Here, cross-sections parallel to the first plate-shaped part 19) are constant from the inner side to the outer side of the hollow member 9 are shown. However, the shapes and areas of the horizontal cross-sections of the outlets 9b may differ depending on the position in the direction of flow. Such examples are shown below.

Note that, here, for convenience, the notations of first embodiment are used, but the modification described below may also be applied to the second embodiment. Further, in the following description, the areas of the horizontal cross-sections of the outlets 9b will be referred to as the "opening areas".

Figure 7A:
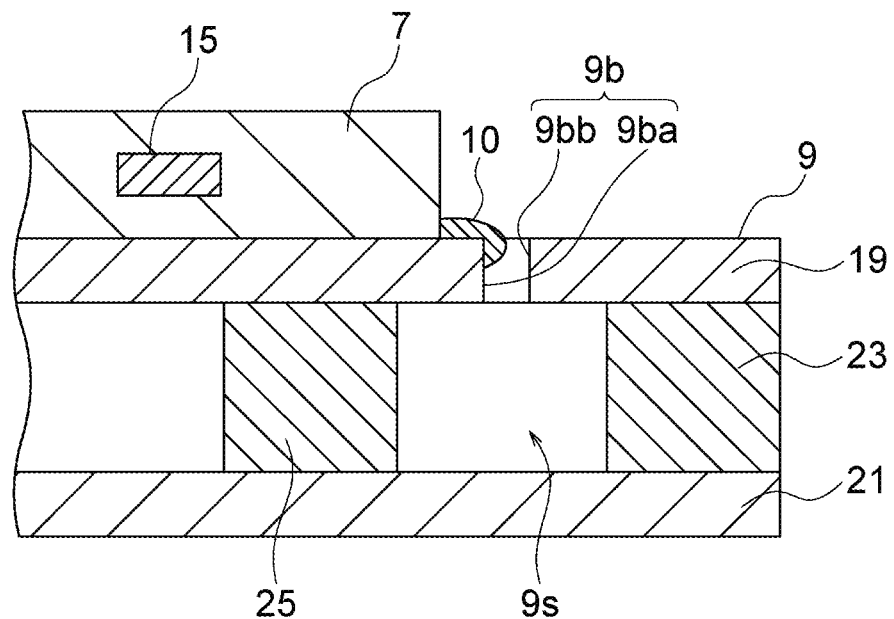
FIG. 7A and FIG. 7B are enlarged sectional views showing a modification of an outlet of the hollow member.

FIG. 7A is a cross-sectional view showing an outlet 9b and its periphery in the heater 1 and corresponds to a part of FIG. 1.

In this modification, each outlet 9b has a large-diameter part 9ba and a small-diameter part 9bb (part where the opening area is narrowed by the bonding material 10 described later) whose opening area is smaller than that of the large-diameter part 9ba. The large-diameter part 9ba is a part that opens toward the inside of the hollow member 9. The small-diameter part 9bb is a part that is located on the outer side of the hollow member 9 from the large-diameter part 9ba and, for example, that opens to the outside of the hollow member 9.

The shape of the horizontal cross-section, the opening area, the length in the direction of flow (here, the vertical direction), the shape of the vertical cross-section (the cross-section shown in FIG. 7A), and the like of each of the large-diameter part 9ba and the small-diameter part 9bb may be appropriately set. For example, the shape of the horizontal cross-section of the large-diameter part 9ba and the shape of the horizontal cross-section of the small-diameter part 9bb may be similar figures or kind of similar figures or may be completely different shapes. The center of the horizontal cross-section of the large-diameter part 9ba (for example, the centroid; the same applies hereinafter) and the center of the small-diameter part 9bb may coincide or may not coincide in a plan view. In each of the large-diameter part 9ba and the small-diameter part 9bb, the shape of the horizontal cross-section may or may not be constant in the direction of flow of the outlet 9b. The opening area of the small-diameter part 9bb may be less than ½ or may be ½ or more of the opening area of the large-diameter part 9ba. The ratio of the length of the small-diameter part 9bb in the direction of flow to the length of the outlet 9b in the direction of flow may be less than ½ or may be ½ or more.

In the example shown in the figure, the large-diameter part 9ba has a shape and size of a horizontal cross-section that are substantially constant in the direction of flow of the outlet 9b. On the other hand, the small-diameter part 9bb has an opening area basically smaller the further to the outer side of the hollow member 9. More specifically, the part of the inner surface of the small-diameter part 9bb on the heater plate 7 side (in FIG. 7A, left side of sheet) is inclined so as to be located further to the side away from the heater plate 7 (in FIG. 7A, right side of sheet) the further to the outer side of the hollow member 9. Due to this, the opening area of the small-diameter part 9bb is gradually reduced. In other words, the center of the horizontal cross-section of the small-diameter part 9bb is farther more from the heater plate 7 to more to the outer side of the hollow member 9.

The change in the opening area of the outlet 9b (formation of the large-diameter part 9ba and the small-diameter part 9bb) may be realized by an appropriate method. In the illustrated example, the bonding material 10 is disposed at part of the inner surface of the outlet 9b, so the outlet 9b has a small opening area in a part of the direction of flow. Due to this, the small-diameter part 9bb (and large-diameter part 9ba whose opening area is larger than small-diameter part 9bb) is comprised. This bonding material 10 may be regarded as a part of the first plate-shaped part 19 (hollow member 9).

The bonding material 10 may be an inorganic material or may be an organic material. As the inorganic materials, for example glass-based ones may be mentioned. In the explanation of the embodiments, referring to FIG. 4A, it has been described that the heater plate 7 and the hollow member 9 may be joined by the adhesive 31. The bonding material 10 may be the same material as or may be a different material from the adhesive 31. In the former case, the bonding material 10 may also be coated on the heater plate 7 or the hollow member 9 simultaneously with the adhesive 31. In other words, the bonding material 10 may be a part of the adhesive 31.

As described above, in the modification shown in FIG. 7A, the outlet 9b has the large-diameter part 9ba that is open to the space 9s and the small-diameter part 9bb that is positioned at the outer side of the space 9s from the large-diameter part 9ba and having an opening area smaller than the opening area of the large-diameter part 9ba.

In this case, for example, the flow rate of the gas discharged from the outlet 9b can be increased by narrowing the opening area by the small-diameter part 9bb. As a result, for example, it is easy for the gas to be made to disperse into the chamber that houses the heater 1. Further, since the opening area is reduced by the small-diameter part 9bb, the probability of dust entering the space 9s from the outside of the hollow member 9 through the outlet 9b is reduced. Compared to an aspect in which the opening area of the entire outlet 9b is reduced (such an aspect is also included in the art according to the present disclosure), for example, the flow of gas can be disturbed in the outlet 9b to mix the gas. Further, the gas discharge direction can also be adjusted by adjusting the position of the small-diameter part 9bb relative to the large-diameter part 9ba in a plan view. For example, in the illustrated example, the center of the small-diameter part 9bb is separated from the heater plate 7 with respect to the center of the large-diameter part 9ba in a plan view, so the gas can be discharged in a direction away from the heat plate 7 to make the gas diffuse inside the chamber.

Figure 7B:
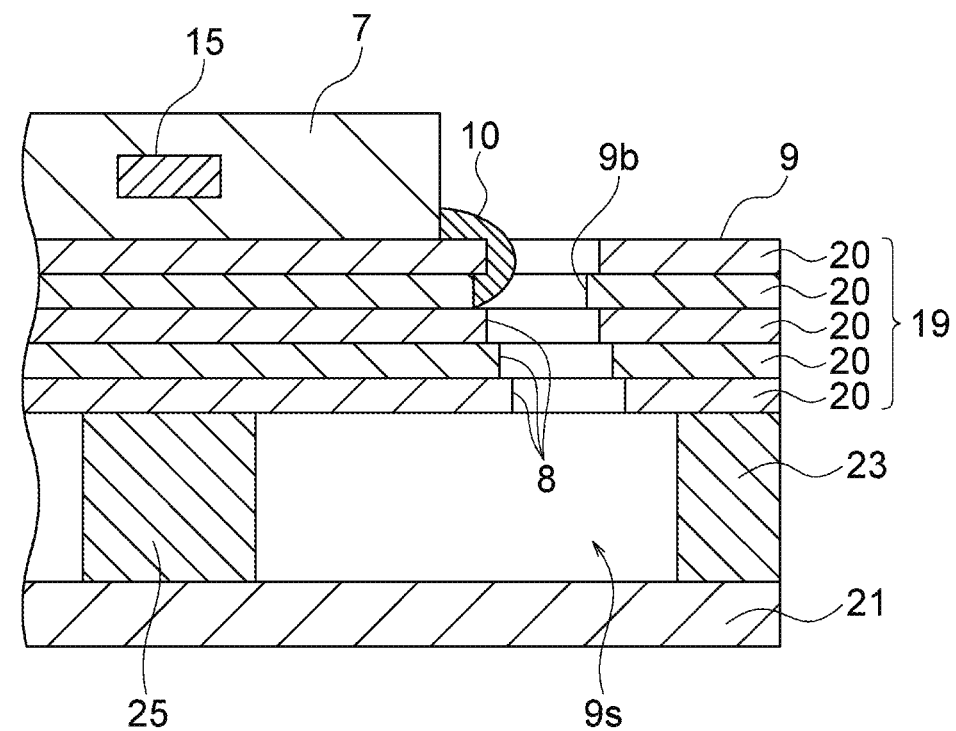

FIG. 7B is a view which shows another modification of an outlet 9b and is a cross-sectional view similar to FIG. 7A.

In this modification, the inner surface (side surface) of the outlet 9b has surface relief in a vertical cross-section (here, a plane parallel to the vertical direction as shown in FIG. 7B) along the direction of flow of the outlet 9b. Note that the modification shown in FIG. 7A, in the same way as the present modification, may also be regarded as having surface relief formed on the side surface of the outlet 9b. However, this modification, unlike the modification of FIG.

7A, is not predicated on the large-diameter part 9ba and the small-diameter part 9bb being configured (although they may be configured).

The number, shapes, dimensions, and the like of the surface relief may be appropriately set. For example, in any vertical cross-section, the length of the step differences formed by the surface relief which is length in the radial direction of the outlet 9b (the amount of offset of the outer edges of adjacent holes 8 among the plurality of holes 8 described later) may be 1/20 or more, may be 1/10 or more, or may be 1/5 or more of the average diameter of the outlet 9b (the average value of the distances between the two side surfaces facing each other in any vertical cross-section mentioned above). Further, due on the presence of the surface relief, the diameter (opening area) of the outlet 9b may be constant or different depending on the position of the outlet 9b in the direction of flow. Further, the surface relief in the vertical cross-section may also form surface relief in the horizontal cross-section.

In the illustrated example, it can be understood that, a plurality of holes 8 connected in the direction of flow of the outlet 9b to configure the outlet 9b are different from each other in the diameters (opening areas) and/or positions in a direction intersecting the direction of flow, thereby the surface relief of the outlet 9b on the space 9s side (or the overall surface relief of the outlet 9b when the bonding material 10 is ignored) is comprised. More specifically, in the illustrated example, the opening shapes and opening areas of the plurality of holes 8 are substantially the same as each other. The plurality of holes 8 are different from each other in the positions in the direction intersecting the direction of flow, thereby the surface relief of the outlet 9b is configured. Therefore, in the vertical cross-section, the projections (or recesses) on one side surface and the recesses (or projections) on the other side surface face each other in the direction intersecting the direction of flow. The lengths of the plurality of holes 8 in the direction of flow may be the same as each other (example shown in the figure) or may be different from each other.

In the illustrated example, up to four holes from the bottom among the plurality of holes 8 are shifted to the left side, while the last one is shifted to the right side (the opposite side from up to then). From another viewpoint, the outlet 9b is bent. However, unlike the illustrated example, all the holes 8 may be shifted to the same side in the direction along the first plate-shaped part 19 (left and right direction on the paper surface) to form surface relief in a stepped manner from the lower surface to the upper surface of the first plate-shaped part 19.

The surface relief of the outlet 9b may be realized by an appropriate method. In the illustrated example, the first plate-shaped part 19 is constituted by a plurality of insulating layers 20. Holes 8 are formed in the insulating layers 20. Further, among at least some of the plurality of the insulating layers 20, the holes 8 are different from each other in the opening areas and/or positions in the plane view (in the illustrated example, only the positions), thereby the surface relief of the outlet 9b is realized. The thicknesses of the plurality of insulating layers 20 may be the same as or different from each other.

The first plate-shaped part 19 including such a plurality of insulating layers 20 may be fabricated, for example, by stacking and firing a plurality of ceramic green sheets for forming the plurality of insulating layers 20. In FIG. 7B, for convenience, the boundaries of the plurality of insulating layers 20 are clearly shown, but in the case of such a method of fabrication, in the completed first plate-shaped part 19, the boundaries of the plurality of insulating layers need not be discernable. Further, the plurality of insulating layers 20, unlike the above, may also be joined by an adhesive.

In the example of FIG. 7B, the bonding material 10 explained with reference to FIG. 7A is also provided. Further, the bonding material 10 also contributes to the realization of the surface relief. In turn, although not denoted by reference sign, in the example of FIG. 7B as well, the small-diameter part is also formed. Note that, in the case, like the example of FIG. 7B, where the surface relief is configured by the main body part (the plurality of insulating layers 20) of the first plate-shaped part 19, conversely to FIG. 7A, the bonding material 10 can be used to flatten part of the surface relief of the main body part.

As described above, in the present modification, the side surface of the outlet 9b has surface relief in the vertical cross-section along the direction of flow of the outlet 9b.

In this case, for example, the gas flow in the outlet 9b is disturbed. As a result, for example, gas mixing and/or gas diffusion into the chamber containing the heater 1 can be expected. Further, for example, the probability of dust entering the space 9s from the outside of the hollow member 9 through the outlet 9b is reduced. Further, for example, when the bonding material 10 is positioned on the side surface of the outlet 9b, the bonding area between the bonding material 10 and the side surface of the outlet 9b increases and the solidified bonding material 10 engages with the surface relief, so the bonding material 10 is easily fixed to the hollow member 9.

Note that in the above first and second embodiments and modifications, the upper surface 7a is an example of a first main surface. The lower surface 7b is an example of a second main surface.

The heater according to the present disclosure is not limited to the above embodiments and modifications and may be implemented in various ways.

For example, the first embodiment and the second embodiment may be appropriately combined. For example, the protrusion (recess) of the second embodiment may be provided in the configuration of the first embodiment in which the pipe passes through the hollow member. In the configuration in the second embodiment in which the hollow member has the inner wall, the pipe may pass through the hollow member and be fixed to the heater plate.

The heater may have functions other than the function as a heater. For example, other than the resistance heating element, an electrode for causing the heater plate to function as an electrostatic chuck and/or an electrode for generating plasma may be provided in the base. Such electrodes may be located, for example, on the first main surface (upper surface) side with respect to the resistance heating element.

Further, for example, the heater is not limited to one having only one layer of resistance heating element and may have two or more layers of resistance heating elements. Further, one layer of resistance heating element may be divided into a plurality of parts or provided with feeding points at a plurality of locations of one resistance heating element to individually control the heat generation amount. In addition to the resistance heating element and the terminals, the heater may have a wiring pattern for connecting the terminals and the resistance heating element in a layer separate from the layer of the resistance heating element. As understood from the above explanation as well, the base in which the resistance heating element is embedded is not limited to one constituted by two insulating layers and may be constituted by an appropriate number of insulating layers.

The space of the hollow member need not communicate with the outside through the inlets and the outlets. In other words, the space of the hollow member need not be a space for flow of fluid. For example, the space may be evacuated or an appropriate gas may be sealed in the space. In this case, the space for example may also function as a heat insulating layer. The fluid that flows through the space of the hollow member or is sealed in the space may also be a liquid.

An inlet need not communicate with the outside of the hollow member via the pipe and may directly communicate with the outside of the hollow member. An outlet need not open on the upper surface of the hollow member and may open on the side surface or the lower surface. A hole penetrating through the heater plate may be formed, and the outlet may communicate with the hole.

The hollow member may have a size equal to or smaller than that of the heater plate in a plan view. The protrusion (see the protrusion 229 of the second embodiment) need not extend annularly in a plan view. For example, a plurality of protrusions may be arranged along the outer edge of the heater plate. From another viewpoint, it is not essential that the recess be formed along with the formation of the protrusion.

Note that the following concept can be extracted from the present disclosure.

Concept 1

A heater including:
a structure body having a first surface, a second surface opposite to the first surface, and a space between the first surface and the second surface; and
a resistance heating element located in the structure body and located on a first surface side other than the space and extending along the first surface, wherein
the structure body includes a plurality of connecting parts connecting a surface of the space at the first surface side and a surface of the space at a second surface side and distributed in the space in a plan view of the first surface.

Regarding the Concept 1, the combination of the base 13 and the hollow member 9 is an example of the structure body, the upper surface 7a is an example of the first surface, and the lower surface of the hollow member 9 is an example of the second surface. In the art of Concept 1, the hollow member need not have the first plate-shaped part on which the heater plate is stacked. For example, the structure body may be configured by a hollow member having a recess on its upper surface and a base of a heater plate that is superimposed on the hollow member (the outer periphery of the recess) or the structure body may be configured by a base of a heater plate having a recess on its lower surface and a plate-shaped member closing that recess. In any case, due to a plurality of connecting parts being provided, for example, heat paths can be formed at any positions in the space and the temperature can be easily equalized.

REFERENCE SIGNS LIST

1 . . . Heater, 7 . . . heater plate, 7a . . . upper surface (first main surface), 7b . . . lower surface (second main surface), 9 . . . hollow member, 9s . . . space, 13 . . . base, 15 . . . resistance heating element, 19 . . . first plate-shaped part, 21 . . . second plate-shaped part, 23 . . . side surface part.

The invention claimed is:

1. A heater comprising:
an insulating base comprising a first main surface and a second main surface on a back of the first main surface,
a resistance heating element extending in the base along the first main surface and the second main surface,
a hollow member, wherein
the hollow member comprises
a first plate-shaped part overlapping the second main surface,
a second plate-shaped part facing the first plate-shaped part through a space,
a side surface part surrounding the space from an outside in a planar direction of the first plate-shaped part and the second plate-shaped part,
a plurality of solid connecting parts located between the first plate-shaped part and the second plate-shaped part, connected to the first plate-shaped part and the second plate-shaped part, and distributed in the space in a perspective plan view of the first main surface, and
an inlet and a plurality of outlets that communicate an inside of the space and an outside of the space,
wherein the plurality of solid connecting parts are radially outwardly located with respect to the inlet in the perspective plan view of the first main surface and the plurality of outlets are located radially outward with respect to the plurality of solid connecting parts in the perspective plan view of the first main surface, and
a pipe that passes through the hollow member in a direction orthogonal to the second main surface and is joined to the second main surface, the pipe including a circumferential direction, and the inlet arranged in the circumferential direction of the pipe.

2. The heater according to claim 1, wherein the space extends from a region overlapping the base to an outside of the base in a perspective plan view of the first main surface.

3. The heater according to claim 1, wherein
the plurality of outlets are located outside the base in the perspective plan view of the first main surface.

4. The heater according to claim 3, wherein the hollow member comprises a protrusion outside the base in a plan view of the first main surface, the protrusion protruding from the first plate-shaped part in a direction which the first main surface faces, and
the plurality of outlets are located on a top surface of the protrusion.

5. The heater according to claim 3, wherein
at least one of the plurality of outlets comprises
a large-diameter part that opens to the space and
a small-diameter part that is located more to an outer side of the space other than the large-diameter part and has an opening area smaller than an opening area of the large-diameter part.

6. The heater according to claim 3, wherein a side surface of at least one of the plurality of outlets comprises a surface relief in a vertical cross-section along a direction of flow of the outlet.

7. The heater according to claim 1, wherein the hollow member comprises a recess that accommodates at least a part of the base on a side where the second main surface is located.

8. The heater according to claim 1, wherein the hollow member further comprises an inner wall that is located between the first plate-shaped part and the second plate-shaped part, and partitions an inside of the hollow member into an inner space at an inside in the plane direction and an outer space at the outside in the plane direction.

9. The heater according to claim 1, wherein
the base is an integrally formed member made of a ceramic, and
the base and the first plate-shaped part are fixed by an adhesive or solid phase bonding.

10. The heater according to claim 1, wherein the base and the hollow member are detachably fixed.

11. The heater according to claim 1, further comprising a pipe comprising one end joined to the second plate-shaped part.

12. A heater system comprising:
a heater according to claim 1, and
a power supply unit that supplies electric power to the resistance heating element.

* * * * *